United States Patent [19]

Patterson, III et al.

[11] 4,241,315
[45] Dec. 23, 1980

[54] ADJUSTABLE CURRENT SOURCE

[75] Inventors: Raymond B. Patterson, III; Grady M. Wood, both of Melbourne, Fla.

[73] Assignee: Harris Corporation, Melbourne, Fla.

[21] Appl. No.: 14,523

[22] Filed: Feb. 23, 1979

[51] Int. Cl.³ .......................... H01L 27/24; H03F 3/45
[52] U.S. Cl. .............................. 330/261; 307/296 R; 357/2
[58] Field of Search .................... 330/307, 254, 261; 307/207, 303, 296 R; 357/45, 51, 2

[56] References Cited

U.S. PATENT DOCUMENTS

| 3,761,787 | 9/1973 | Davis | 357/35 |
| 3,818,252 | 6/1974 | Chiba et al. | 307/207 |
| 4,045,746 | 8/1977 | Wheatley, Jr. | 330/307 |

*Primary Examiner*—William D. Larkins
*Attorney, Agent, or Firm*—Leitner, Palan, Lyman, Martin & Bernstein

[57] ABSTRACT

A current source having two current paths connected as current mirrors with an amorphous material device in one of the current paths which is electrically alterable from a high impedance state to lower high impedance states without switching to a low impedance state. A diode interconnects the amorphous material element to the current path to prevent damage to the current path during electrical alteration of the amorphous material device. The current source is included in a differential amplifier and operational amplifier to provide fine incremental trim or offset adjustment.

17 Claims, 8 Drawing Figures

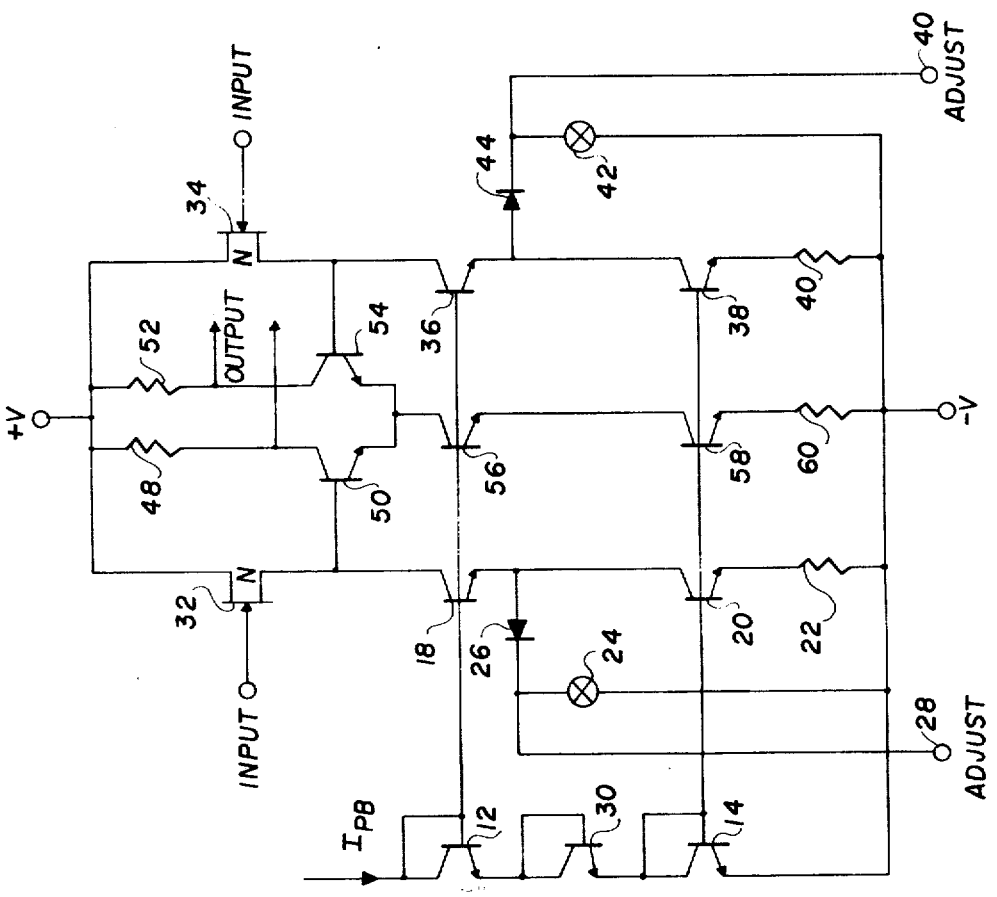
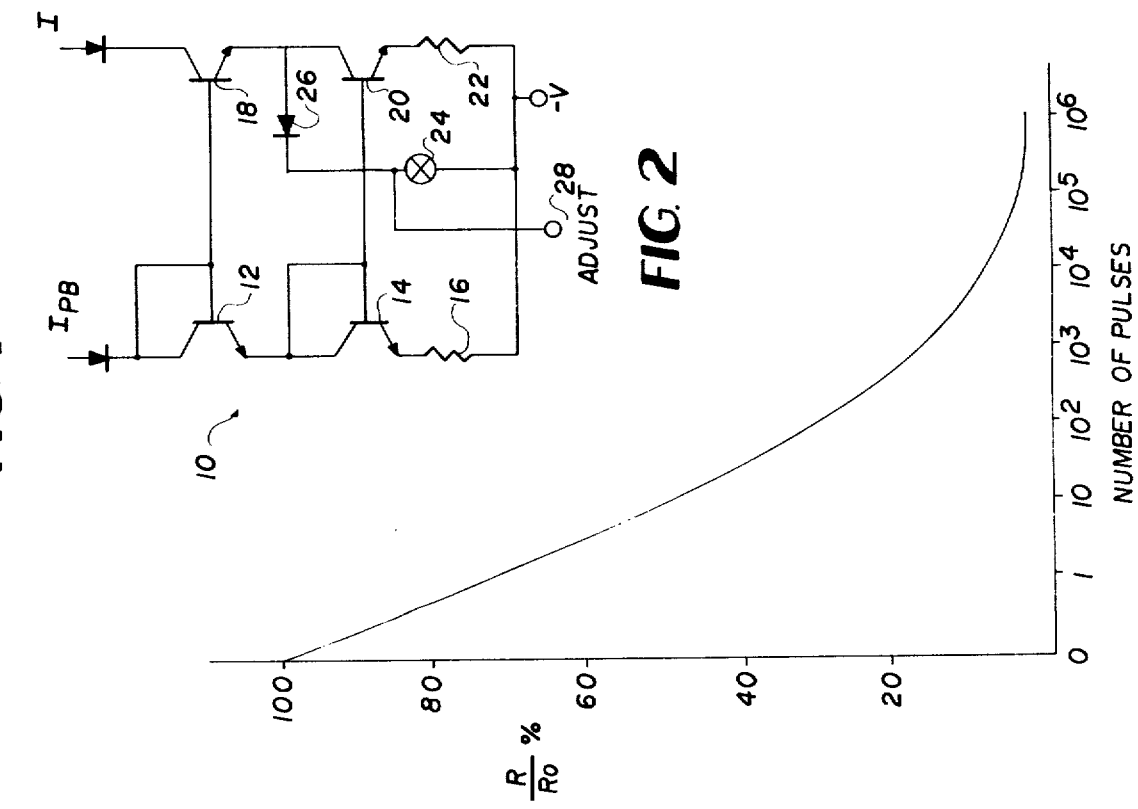

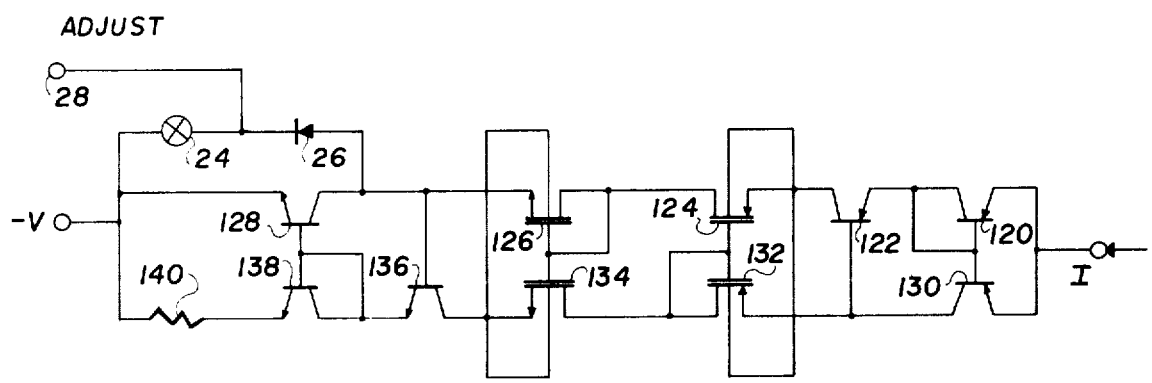
FIG. 6
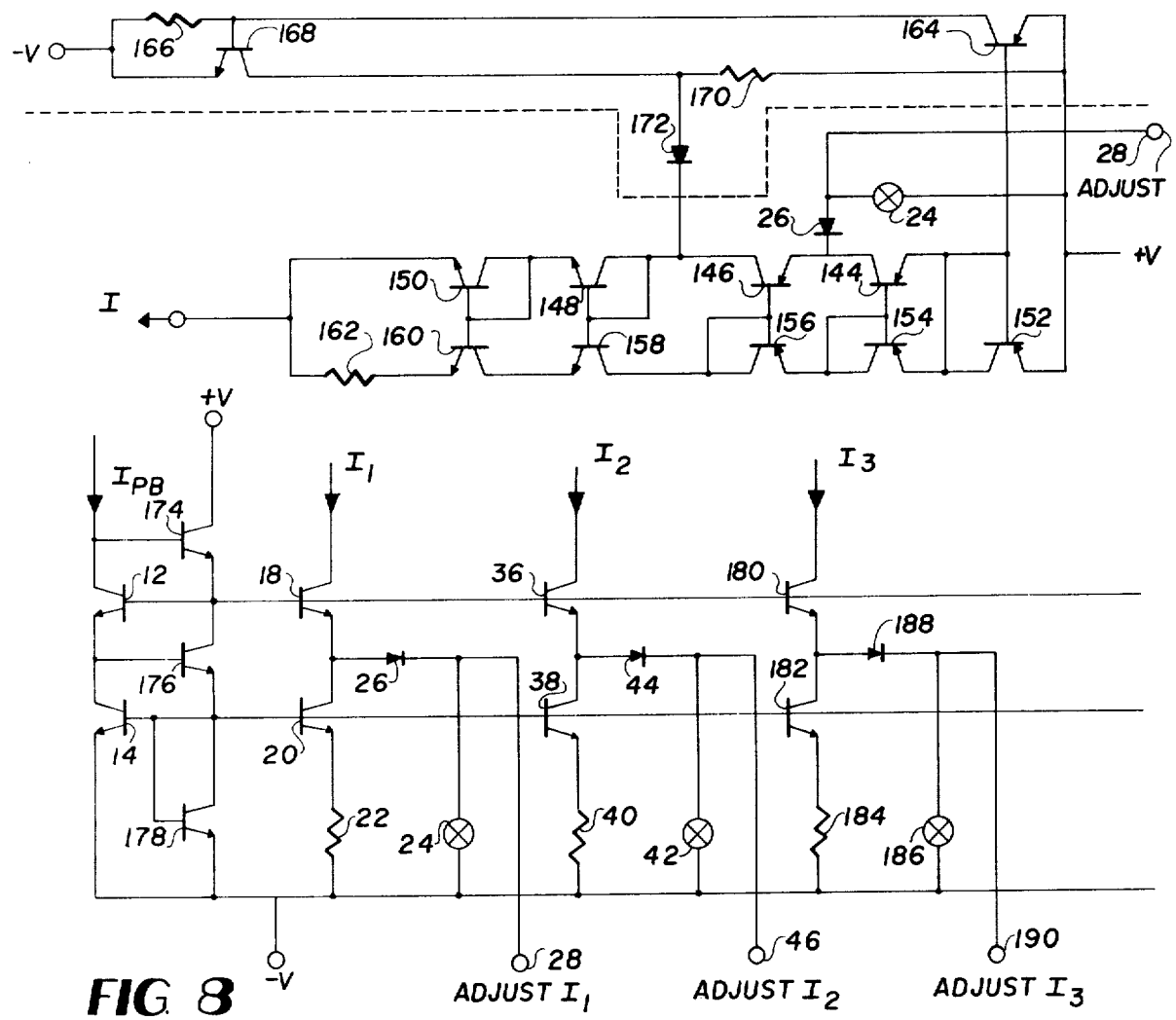
FIG. 7
FIG. 8

ADJUSTABLE CURRENT SOURCE

BACKGROUND OF THE INVENTION

1. Field of the Invention

The present invention relates generally to adjustable current sources and more specifically to a method and structure for adjusting the offset of differential and operational amplifiers by electrically altering the current source therein.

2. Description of the Prior Art

Operational amplifiers are typically designed with a differential amplifier for the input stage. The balance of the differential amplifier is dependent on component match. Processing variables prevent exact match from occurring. This mismatch appears as offset voltage and/or offset current. In some applications this offset voltage cannot be tolerated and must be adjusted or corrected. There are three basic prior art approaches, i.e.

(1) offset adjustment by external potentiometer;
(2) automatic offset correction by additional circuitry;
(3) offset adjustment by laser trimming of thin film resistors.

The external potentiometer appoach uses a potentiometer external to the IC package to effect offset adjust. This appoach has the disadvantage of requiring an additional component large in comparison to the IC package, thereby requiring extra board space and expense. The "automatic correction circuit" approach requires extensive additional circuitry which increases the chip area and over all cost. The laser trimming approach requires capital equipment investment by the manufacturer. Also, the laser trimming must be performed prior to packaging.

As an advancement over these prior art techniques, U.S. Pat. No. 3,761,787 to Davis et al., described a circuit for internally adjusting the offset voltage of a bipolar transistor operational amplifier using a two segment collector with one of the segments being connected to the collector conductor by fusible metal links. As illustrated in FIG. 2 of that patent, two probe pads 50 and 52 are interconnected by a fusible link 53 and connect the smaller collector 49 to the collector conductor 48. If trimming is necessary, a voltage is applied across the probe pads 50 and 52 to burn out the fusible link 53. This structure requires special probe contact pads and accessible prior to packaging.

The techniques of the Davis et al. provide a rough adjustment of the offset, generally only a simple adjustment. There is a need for the integration of the offset adjustment into the operational amplifier while preserving the fine adjustment of external techniques.

SUMMARY OF THE INVENTION

The current source of the present invention includes an incrementally adjustable amorphous material device which adjusts the impedence and consequently the current characteristics of the current source, and may be incorporated in a differential amplifier or the differential amplifier stage of an operational amplifier to provide offset adjustment of the differential and operational amplifiers. The current source includes two current paths connected as current mirrors. The amorphous material device is connected between a voltage supply terminal of the current source and one current path of the current source by a diode. The diode provides normal current of the second current path to flow through the amorphous device and prevents current used to electrically alter the impedance of the amorphous material device from entering the current path. An adjustment terminal is connected to the junction of the diode and the amorphous material device. The amorphous device which is in a high impedance, substantially amorphous state is electrically altered by applying a plurality of short duration current pulses therethrough to reduce the impedance to a lower high impedance, substantially amorphous state without switching the amorphous material device to a low impedance, crystalline state. A single amorphous element in one of the current paths will provide adjustment of the current path as well as the self-starting point of a self-starting current source. Additional current paths may be provided and connected to the first current path as current mirrors and each include their own separate amorphous material device and diode to provide a plurality of adjustable currents in a single current source. Incorporation of the current source into a differential amplifier and into an operational amplifier would include the two current paths of the differential amplifier each including an amorphous material device and associated diode. After measuring the offset of the differential amplifier or operational amplifier, the appropriate amorphous element is electrically altered to produce the desired offset.

OBJECTS OF THE INVENTION

An object of the present invention is to provide an integrated current source capable of fine current adjustment.

Another object is to provide a differential or operational amplifier having an incremental adjustable offset capability wherein the adjustment is accomplished by applying voltages to external leads.

A further object of the invention is to provide a differential or operational amplifier with offset adjustment capability requiring no special steps of manufacture or additional chip area.

Still another object of the invention is to provide an integrated, adjustable current source for differential and operational amplifiers wherein the offset may be incrementally adjusted by electrical alteration.

Other objects, advantages and novel features of the present invention will become apparant from the following detailed description of the invention when considered in conjunction with the accompanying drawings.

BRIEF DESCRIPTION OF THE DRAWINGS

FIG. 1 is a schematic of a current source incorporating the principles of the present invention.

FIG. 2 is a graph of the percentage of impedance change versus the number of current pulses for an amorphous material device.

FIG. 3 is a schematic of a differential amplifier incorporating the principles of the present invention.

FIG. 6 is a schematic of a self-starting primary bias current source incorporating the principles of the present invention.

FIG. 7 is a schematic of another self-starting primary bias current source incorporating the principles of the present invention.

FIG. 8 is a schematic of a multiple adjustable current sources incorporating the principles of the present invention.

DESCRIPTION OF THE PREFERRED EMBODIMENTS

Figure 4:
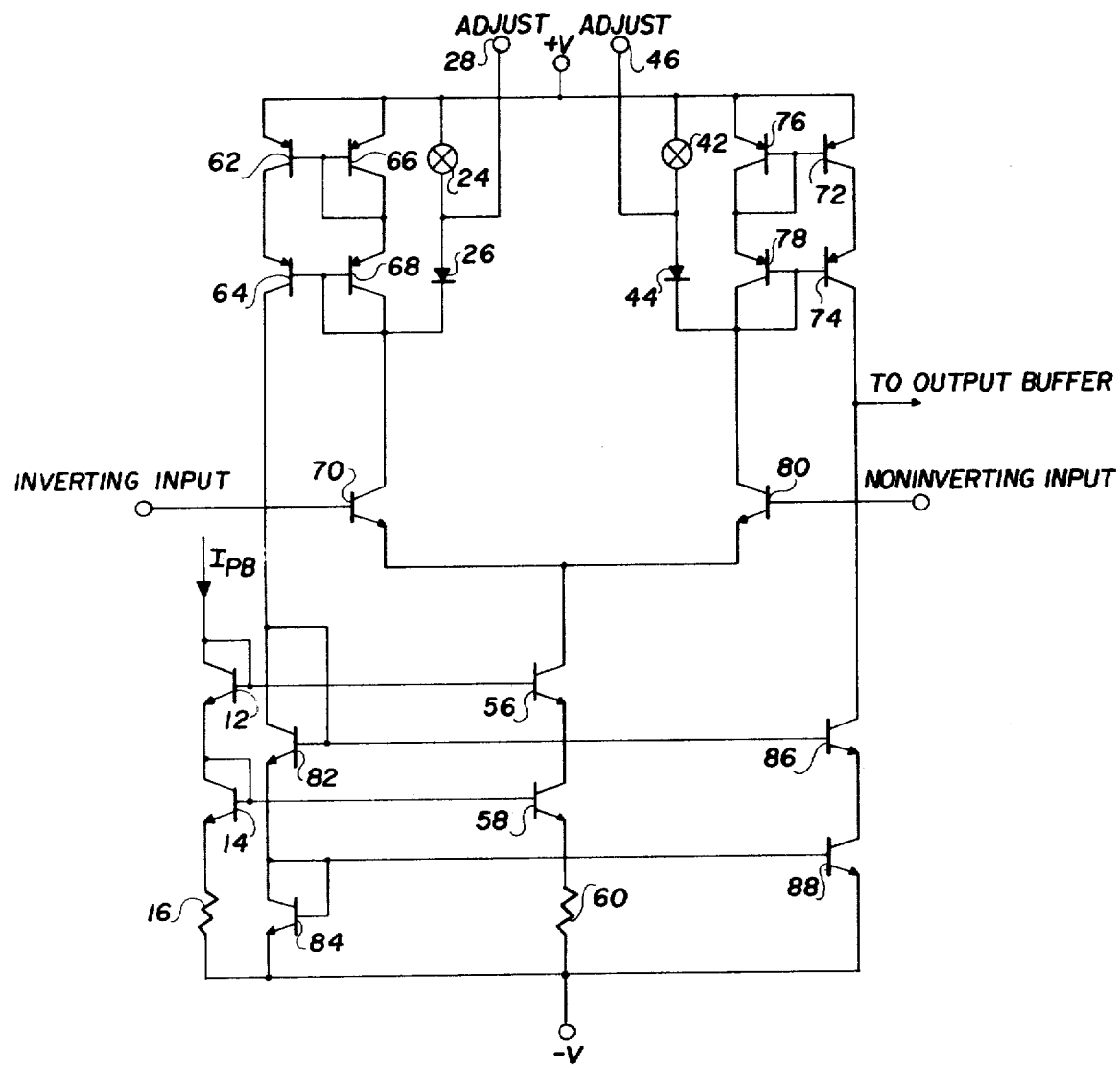
FIG. 4 is a schematic of a differential amplifier input stage for an operational amplifier incorporatiing the principles of the present invention.

FIG. 1, which illustrates an adjustable current source 10, has a first current path including bipolar transistors 12 and 14 and resistor 16 and a second current path including bipolar transistors 18 and 20 and resistor 22. The bases of transistor 12 and 18 and of 14 and 20 are connected together as well as the collector of transistors 12 and 14 being connected to the bases to provide a current mirror arrangement between the two current paths. The resistors 16 and 22 are connected to a negative voltage supply terminal $-V$. A primary bias current $I_{PB}$ is applied to the collector of transistor 12 and the output of the current source is taken off the collector of transistor 18. An amorphous material device 24 is connected to the supply voltage terminal $-V$ and is also connected at its other terminal through diode 26 to the second current path at the junction between transistors 18 and 20. The diode 26 allows the current I which flows in the second current path from the emitter of transistor 18 to flow through the amorphous memory device 24. An adjustment terminal 28 is connected to the junction of the diode 26 and the amorphous material device 24. To adjust the value of the amorphous material device 24, a voltage is applied to terminal 28 to create a current through device 24 to alter its impedance. The diode 26 prevents this current from entering the second current path and damaging transistors 18 and 20.

FIG. 2 illustrates the relationship of the percentage relative to the original impedance of the impedance state of the amorphous material device 24 relative to the number of current pulses applied therethrough. The amorphous memory device 24 may be an amorphous chalcogenide memory material sandwiched between two electrodes. This device may be formed on the surface of the integrated circuit of the current source 10. Thus, no additional chip area is needed. Similarly, the diode 26 may be formed using the process steps that form bipolar transistors and thus no additional processing steps are needed. The incremental resistance change of amorphous material device 24 is proportional to the current amplitude which is generally between 10 to 50 milliamps. The pulses used for FIG. 2 were 30 milliamps. The current pulse must be sufficiently short to prevent the phase transition of the high impedance, substantially amorphous state to the low impedance, substantially crystalline state. The duration is typically one microsecond pulses spaced a minimum of five microseconds apart. The initial resistance value of the element prior to any current pulses is a function of the amorphous material composition, the degree of crystallization resulting from the material deposition and processing, and geometric factors (cross-sectional area, thickness, etc.). For the amorphous memory materials presently available, the diode 26 should have a reverse breakdown voltage in the order of 40 volts.

A differential amplifier incorporating the adjustable current source of FIG. 1 to allow adjustment of the offset characteristics of the differential amplifier is illustrated in FIG. 3. The common elements of FIG. 1 and FIG. 3 have the same number. Since the amorphous material device 24 has a rather large negative temperature coefficient of resistance, approximately 0.4% per degree centigrade, a temperature compensation device is provided between bipolar transistors 12 and 14. As illustrated, a transistor 30, is connected as a forward biased diode operating at moderate current densities and exhibiting a negative coefficient of voltage on the order of 2 millivolts per degree centigrade or around 0.3% per degree centigrade. The diode 30 produces a voltage across amorphous material device 24, which decreases about 0.3% per degree centigrade leaving a net temperature coefficient of 0.1% per degree centigrade.

The differential amplifier of FIG. 3 includes a first current path having an N channel field effect transistor 32 connected in series between the $+V$ supply voltage terminal and transistor 18. A second path of the differential amplifier includes an N channel FET 34 connected in series with bipolar transistors 36 and 38 and resistor 40. An amorphous material device 42 and diode 44 are connected across transistor 38 and resistor 40 and includes an adjust terminal 46. The output stage of the differential amplifier includes a resistor 48 and transistor 50 and resistor 52 and transistor 54. The differential transistors 50 and 54 are both connected in series with bipolar transistors 56 and 58 and resistor 60. The current paths of bipolar transistors 36, 38, and resistor 40 and bipolar transistors 56 and 58 and resistor 60 are connected in a current mirror relationship with the primary biasing current path through bipolar transistors 12, 30 and 14. The input of the differential amplifier are at the gates of the field effect transistors 32 and 34 and the output are taken at the collector of transistors 50 and 54.

After fabrication, the offset of voltage and/or current of the differential amplifier is measured. Upon determination of the offset, the appropriate adjust terminal 28 or 46 is selected to create current pulses to diminish the impedance of the selected amorphous material device and thereby trim or reduce the offset between the current paths. By providing amorphous material device in each current path of the differential amplifier, adjustment may be made in either direction even though the resistance of the amorphous device may only be lowered.

An example of the operation and adjustibility of the circuit in FIG. 3 will be illustrated. Let each of the N channel FET's 32 and 34 be biased at 50 microamps and that their small signal $g_m = 100$ umhos. As result of the manufacturing process, assume that FET 32 has 12 millivolts less $V_{gs}$ than the FET 34. Assuming that the voltage across diode 26 and amorphous material device 24 is 1.7 volts and the voltage across diode 26 with 1 microamp forward current is 0.5 volts. Thus, the current required to adjust the offset is 100 umhos times 0.012 volts or 1.2 microamps. At 25 degrees centigrade, the voltage which this current would drop across diode 26 is $0.5 + 0.026 \ln (1.2/1.0)$ which equals 0.505 volts. The remainder of the 1.7 volts or 1.195 volts appears across the amorphous device 24. Thus, for the 1.2 microamps and 1.195 volts, the value of amorphous material device 24 must be 0.996 megohms. With a typical starting value for resistance of an amorphous material device 24 being approximately 6 megohms, the resistor must be dropped to 16.6 percent of its initial value which would require approximately 1000 pulses using the curve of FIG. 2. It should be noted with the temperature compensating device 30 in the circuit using the parameters just described, the resulting offset, would be 0.6 millivolts at 75 degrees centigrade and 1.2 millivolts at 125 degrees centigrade. The circuit without the temperature compensation device 30 would result with an offset of 2.4 millivolts at 75 degrees centigrade and 4.8 millivolts at 125 degrees centigrade. Both these conditions are after a trim was made at 25 degrees centigrade.

Another configuration of a differential amplifier which may be used in an operational amplifier including an adjustable current source according to the present invention is illustrated in FIG. 4. Amorphous material device 24 and diode 26 are connected to a second path of a current mirror, having bipolar transistors 62, 64, 66 and 68, which is connected to an input transistor 70. The amorphous material device 42 and diode 44 are connected to a second path of a current source having bipolar transistors 72, 74, 76 and 78 connected as a current mirror and connected to the input transistor 80. The first path of the current mirror having bipolar transistor 62 and 64 is connected in series with transistors 82 and 84. Similarly, the first path of the current mirror including transistors 72 and 74 is connected in series with transistors 86 and 88. The transistors 82, 84, 86 and 88 are connected as a current mirror. A measurement of the offset of the paths is measured and adjusted using the appropriate terminal 28 or 46.

Figure 5:
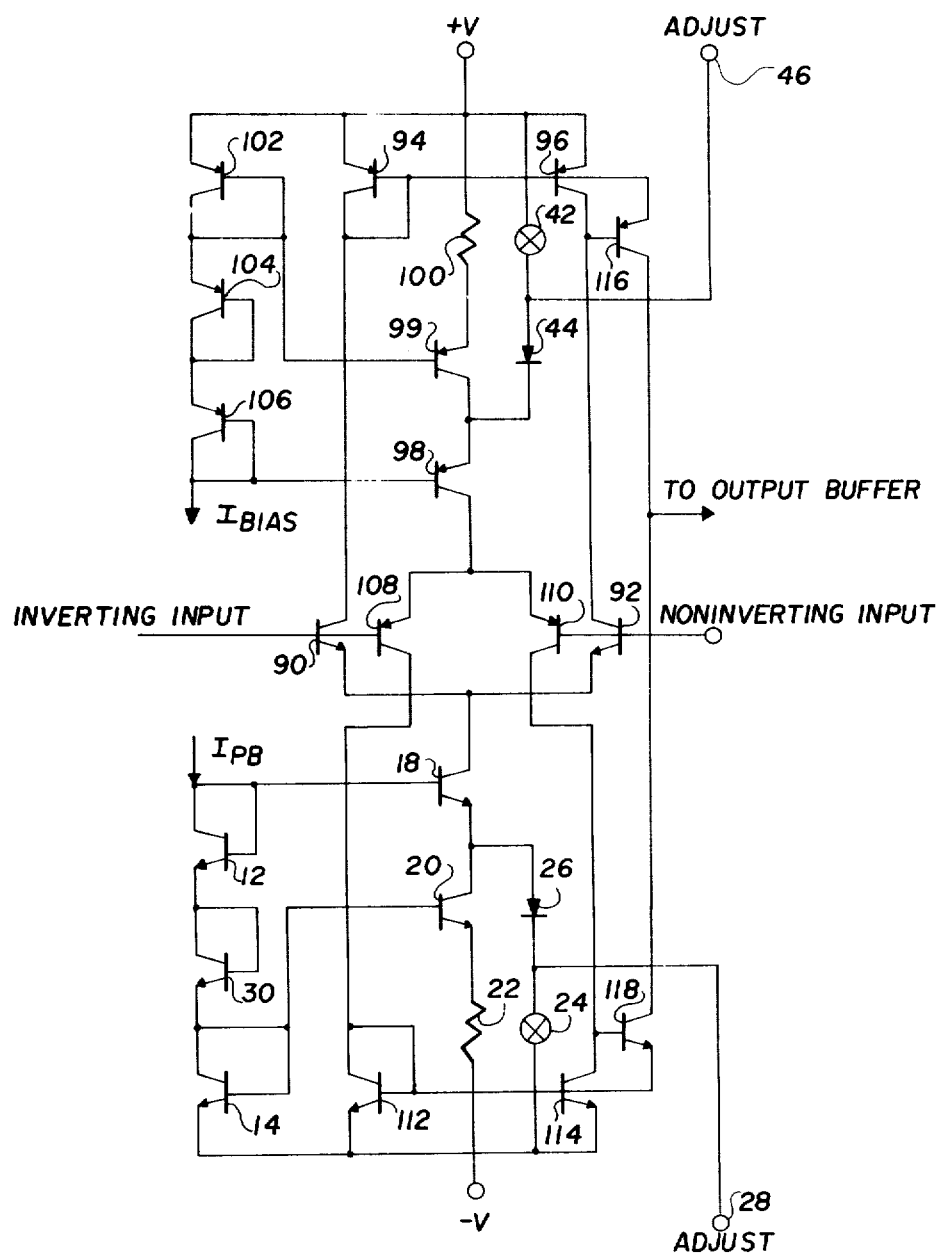
FIG. 5 is a schematic of another differential amplifier incorporating the principles of the present invention.

Another differential amplifier incorporating the principles of the present invention is illustrated in FIG. 5. The adjustable current source of FIG. 1 is connected to a pair of input transistors 90 and 92 to which are connected a pair of transistors 94 and 96 connected in a current mirror arrangement. The amorphous material device 42 and diode 44 are connected to a current path including transistors 98 and 99 and resistor 100. This current path is connected in a current mirror arrangement with a current path including transistors 102, 104 and 106. The transistor 104 is a temperature compensation device equivalent to 30. It should be noted that 98, 99, 100, 102, 104, and 106 operate in the same manner as 18, 20, 22, 12, 30 and 14 respectively. The current path of transistor 98 and 99 and resistor 100 is connected to input transistors 108 and 110 which are connected to transistors 112 and 114 that are connected in a current mirror arrangment. Output transistor 116 is connected to the collector of transistor 96 and output transistor 118 is connected to the collector transistor 114. The offset of the circuit may be adjusted as described for FIG. 3.

The adjustable current source of FIGS. 1 and 3-5 have required the use of a primary biasing current. FIGS. 6 and 7 illustrate embodiments of self-starting primary bias current sources. Amorphous material device 24 and diode 26 are connected to a first current path including bipolar transistors 120, 122, field effect transistors 124 and 126 and bipolar transistor 128. The second current path includes bipolar transistors 130, field effect transistors 132, 134 and bipolar transistors 136, 138 and resistor 140. To provide a self-starting feature, the emitter area of transistor 138 is N times greater than the emitter area of transistor 128. The resistance 140 is selected to be less than nkT/qI/2I. The current I of the FIG. 6 is adjusted using the same technique as previously described.

Another self-starting primary bias current source is illustrated FIG. 7 wherein the amorphous material device 24 and diode 26 are connected to a first current path including bipolar transistors 144, 146, 148 and 150 connected in a current mirror relationship with a second current path including bipolar transistors 152, 154, 156, 158 and 160 and resistor 162. As in the previous figure, the area of the emitter of transistor 160 is N greater than the emitter area of transistor 150. In this example, the resistance 162 is selected to be nkT/qI/2I. The additional self-starting circuitry includes a transistor 164 connected in series with a resistor 166 and a transistor 168 connected in series with a resistor 170. The base of transistor 164 is connected to the base of transistor 152. The collector of transistor 168 is connected to the first current path by a diode 172. The operation of the self-starting circuits of FIGS. 6 and 7 are well known and thus will not be discussed in detail. They are just presented to illustrate that the current of a current source may be adjusted by provided an amorphous material device whether the current source be self-starting or not.

FIG. 8 illustrates the application of the principle of the present invention to a multitude of current sources individually adjustable by individual amorphous material devices. A primary biasing current is fed through transistors 12 and 14 which include a second current path having bipolar transistors 174, 176 and 178 connected thereto in a current mirror arrangement. In addition to the third current path of bipolar transistors 18 and 20 and resistor 22 and the fourth current path of bipolar transistors 36 and 38 and resistor 40, a fifth current path including bipolar transistors 180, 182 and resistor 184 is shown. Amorphous material device 186 with diode 28 and adjust terminal 190 are connected to the current path of bipolar transistors 180 and 182. Each of the current paths are connected as current mirrors to the primary current path. The current in the third, fourth and fifth current paths are individually adjustable through the adjustment terminals 28, 46 and 190. The adjustment is carried out using the method described for FIG. 3.

From the preceding descriptioon of the preferred embodiments, it is evident that the objects of the invention are attained in that an adjustable current source is provided using amorphous material devices whose impedance can be incrementally adjusted to adjust the current in the current source. This current source may be used in differential and operational amplifiers to adjust the offset characteristics of the amplifiers. Although the invention has been described and illustrated in detail in reference to specific circuitry, it is to clearly understood that the same is by way of illustration and example only and is not to be taken by way of limitation. It should be noted that current source as used in the present specification and claims is generic to current source and current sinks. The spirit and scope of this invention is to be limited only by the terms of the appended claims.

What is claimed:

1. An adjustable current source comprising:
   a first current path connected to a voltage supply terminal;
   a second current path connected to said supply terminal substantially in parallel with said first current path;
   a control electrode of a first and second transistor in said first and second current paths respectively being interconnected to one of said current paths to form a current mirror; and
   an amorphous material device in a part-on high impedance, substantially amorphous state electrically alterable to lower part-on high impedance, substantially amorphous states connected to said supply terminal and forming a part of said second current path to adjust the impedance of said second current path and consequently the current through said second current path.

2. The adjustable current source according to claim 1 including a diode connecting said amorphous material device to said second current path to provide current flow from said second current path through said amorphous material device during operation of said current source and to prevent current flow to said second current path during electrical alteration of said amorphous material device.

3. The adjustable current source according to claim 2 including an adjustment terminal connected to the junction of said diode and said amorphous material device for providing external access to produce current to electrically alter said amorphous material device.

4. The adjustable current source according to claim 1 wherein said second current path includes a pair of transistors connected in series and said amorphous material device is connected to the junction of said transistors.

5. The adjustable current source according to claim 1 wherein said first current path includes a transistor having a greater current capacity than a corresponding transistor in said second current path to provide a self-starting current source.

6. The adjustable current source according to claim 1 wherein said first current path includes means for substantially compensating the variation of the characteristics of said amorphous material device in response to temperature variations.

7. The adjustable current source according to claim 1 including a third current path connected to said voltage supply terminal and having a third transistor whose control electrode is connected to the control electrode of said first transistor to form with said first current path a current mirror, an amorphous material device in said third current path as the amorphous material device in said second current path, said amorphous material devices being individually electrically alterable to provide different currents through said second and third current paths.

8. In an operational amplifier having a differential amplifier input stage with first and second separate parallel current paths between a pair of supply voltage terminals and an adjustable impedance means in each of said current paths, the improvement being said adjustable impedance means comprising an amorphous material device in a part-on high impedance, substantially amorphous state electrically alterable to lower part-on high impedance, substantially amorphous states without switching to an "on" low impedance, substantially crystalline state to adjust the offset between said current paths.

9. The operational amplifier according to claim 8 wherein said amorphous material device includes a first electrode connected to one of said supply voltage terminal of said operational amplifier and a second electrode, and a diode connects said second electrode to a respective current path at a point between said pair of supply voltage terminals to provide current flow from said current path through said amorphous material device during operation of the operational amplifier and to prevent current flow to said current path during electrical alteration of said amorphous material device.

10. The operational amplifier according to claim 9 including an adjustment terminal connected to said second electrode for providing external access to produce current to electrically alter said amorphous material device.

11. A differential amplifier comprising:
first and second supply terminals;
a first and second parallel current paths between said first and second supply terminals;
an amorphous material device in each current path in a part-on high impedance, substantially amorphous state electrically alterable to lower part-on high impedance, substantially amorphous state;
the impedance of said amorphous material devices being electrically alterable to adjust the offset between said current paths.

12. The differential amplifier according to claim 11 wherein said amorphous material device includes a first electrode connected to one of said supply voltage terminals of said operational amplifier and a second electrode, and a diode connects said second electrode to a respective current path at a point between said pair of supply voltage terminals to provide current flow from said current path through said amorphous material device during operation of the differential amplifier and to prevent current flow to said current path during electrical alteration of said amorphous material device.

13. The differential amplifier according to claim 12 including an adjustment terminal connected to said second electrode for providing external access to produce current to electrically alter said amorphous material device.

14. The differential amplifier according to claim 11 wherein said current paths each include an input transistor and a current source in series and said amorphous material device is connected as part of the current source.

15. The differential amplifier according to claim 11 wherein said amorphous material device is in an integrated circuit of said differential amplifier.

16. A method of adjusting the current in a current source having a first current path and a second current path, first and second transistors in said first and second current paths respectively being interconnected to said first current path to form a current mirror comprising:
connecting an amorphous material device in said second current path as an impedance of said second path having a high impedance, substantially amorphous state; and
applying current pulse or pulses through said amorphous material to incrementally reduce said high impedance state to lower high impedance states without switching said amorphous material element to a low impedance, substantially crystalline state.

17. A method of adjusting the offset of a differential amplifier having a first and second current paths comprising:
connecting an amorphous material device in each of said current path as an impedance of said paths having a high impedance, substantially amorphous state;
measuring the offset between said first and second current paths; and
applying current pulse or pulses through a selected amorphous material device to incrementally reduce said high impedance state to lower high impedance states without switching said amorphous material element to low impedance, substantially crystalline state to reduce said offset.

* * * * *